United States Patent
Hyun et al.

(10) Patent No.: US 9,048,845 B2
(45) Date of Patent: Jun. 2, 2015

(54) SEMICONDUCTOR SYSTEM

(71) Applicant: SK hynix Inc., Gyeonggi-do (KR)

(72) Inventors: Sang-Ah Hyun, Gyeonggi-do (KR); Hyun-Woo Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/106,800

(22) Filed: Dec. 15, 2013

(65) Prior Publication Data

US 2015/0002199 A1   Jan. 1, 2015

(30) Foreign Application Priority Data

Jun. 28, 2013 (KR) ........................ 10-2013-0075442

(51) Int. Cl.
   G06F 3/00     (2006.01)
   G06F 13/00    (2006.01)
   G06F 1/26     (2006.01)
   H03L 7/00     (2006.01)

(52) U.S. Cl.
   CPC ........................................ *H03L 7/00* (2013.01)

(58) Field of Classification Search
   None
   See application file for complete search history.

(56) References Cited

U.S. PATENT DOCUMENTS

| | | | | |
|---|---|---|---|---|
| 5,315,533 | A * | 5/1994 | Stich et al. | 700/298 |
| 6,079,025 | A * | 6/2000 | Fung | 713/323 |
| 8,076,979 | B2 * | 12/2011 | Kathuria et al. | 331/1 R |
| 2004/0039963 | A1 | 2/2004 | Burch | |
| 2004/0075600 | A1 * | 4/2004 | Vera et al. | 341/166 |
| 2007/0076517 | A1 * | 4/2007 | Kyung | 365/233 |
| 2010/0064124 | A1 * | 3/2010 | Rinne et al. | 713/1 |
| 2010/0211811 | A1 * | 8/2010 | Zhou et al. | 713/330 |
| 2010/0254443 | A1 * | 10/2010 | Scharrer et al. | 375/220 |
| 2010/0332863 | A1 * | 12/2010 | Johnston | 713/300 |

FOREIGN PATENT DOCUMENTS

KR   1020060117235   11/2006

* cited by examiner

*Primary Examiner* — Michael Sun
(74) *Attorney, Agent, or Firm* — IP & T Group LLP (57) ABSTRACT

A semiconductor system includes a controller and a semiconductor device that may communicate signals with the controller through a single input/output pad. The semiconductor device includes a self power generation block that may generate a driving voltage in response to a first signal inputted from the controller through the single input/output pad, and generate a start-up signal when the driving voltage is over a set voltage, a state machine block that may detect a pulse width of a second signal inputted from the controller through the single input/output pad, in response to the start-up signal, and may generate commands and data in response to the pulse width, and a data output block that may convert the data into a third signal of a current level corresponding to the data and output the third signal to the controller through the single input/output pad, in response to the commands.

23 Claims, 6 Drawing Sheets

SEMICONDUCTOR SYSTEM

CROSS-REFERENCE TO RELATED APPLICATIONS

The present application claims priority of Korean Patent Application No. 10-2013-0075442, filed on Jun. 28, 2013, which is incorporated herein by reference in its entirety.

BACKGROUND

1. Field

Exemplary embodiments of the present invention relate to a semiconductor design technology, and more particularly, to a method for controlling power supply and processing data between a controller and a semiconductor device by using a single port.

2. Description of the Related Art

In general, a memory with one pair of input and output terminals is referred to as a single port memory, and a memory with at least two pairs of input and output terminals is referred to as a multi-port memory. Because the single port memory has one input terminal and one output terminal, it may have access to one data at a time, and because the multi-port memory has several input terminals and several output terminals, it may have simultaneous access to several data at a time.

However, since a plurality of ports and a plurality of pads are provided in the multi-port memory, there are limits in terms of the size and the shape of a chip for the multi-port memory. Also, it is difficult to apply the memory to various fields such as the field of a bio chip. For instance, in the case of a bio chip operating deep into the heart, if a controller occupies a large volume, the controller and a memory device are separated from each other in such a manner that a memory chip with a small size is inserted adjacent to the heart and a circuit for supplying power and serving as the controller is mounted onto the outer part of the human body. In this regard, since a number of ports and a number of pads are to be mounted to connect the memory device with the external controller and a battery, they may cause a strain on the heart or make a patient uncomfortable.

While wireless communication between a memory device and a controller has been suggested as an alternative, in the case of wireless communication such as RF communication, the probability of exposure to hacking is substantial. Since an antenna and a corresponding signal processing apparatus are to be disposed, circuit design may be complicated.

Therefore, demand for a single port memory capable of being utilized in various fields is increasing.

SUMMARY

Various embodiments are directed to a semiconductor system in which the number of ports and/or pads between a controller and a memory device is decreased in such a way as to allow targeted signals to be transmitted and received, and data to be processed through one port or pad.

In an exemplary embodiment, a semiconductor system may include a controller and a semiconductor device that may communicate one or more signals with the controller through a single input/output pad, wherein the semiconductor device includes a self power generation block that may generate a driving voltage in response to a first signal inputted from the controller through the single input/output pad, and may generate a start-up signal when the driving voltage is over a set voltage, a state machine block that may detect a pulse width of a second signal inputted from the controller through the single input/output pad, in response to the start-up signal, and may generate commands and data in response to the pulse width of the second signal, and a data output block that may convert the data into a third signal of a current level corresponding to the data and output the third signal to the controller through the single input/output pad, in response to the commands.

In an exemplary embodiment, a method for driving a semiconductor system including a controller and a semiconductor device may include inputting a first signal from the controller to the semiconductor device through a single input/output pad and generating a driving voltage of the semiconductor device using the first signal in the semiconductor device, inputting a second signal from the controller to the semiconductor device through the single input/output pad and generating commands and data in response to a pulse width of the second signal in the semiconductor device, when the driving voltage reaches a set level, and converting the data into a third signal of a current level corresponding to the data in response to the commands in the semiconductor device and outputting the third signal from the semiconductor device to the controller through the single input/output pad.

In an exemplary embodiment, a semiconductor system may include a single input/output pad, a controller that may transfer first and second signals through the single input/output pad and may sense the signals transferred through the single input/output pad, and a semiconductor device that may receive the first and second signals through the single input/output pad, may generate a driving voltage in response to the first signal, and commands and data in response to the second signal, and transfer a third signal corresponding to the data to the controller through the single input/output pad in response to the commands.

In accordance with the above embodiments, the number of ports and/or pads between a controller and a memory device is decreased in such a way as to allow targeted signals to be transmitted and received, and data to be processed through one port, whereby a chip may be grafted and expanded to various application fields. For example, since operations are performed through one pad and thus a specific pattern is not needed, a chip may be inserted into not only the front surface but also the edge of a credit card. It may be inserted into a winding part of a key, for example. Therefore, a key recognition apparatus attached to the door of a car or a house may react with only a chip which is embedded in a key, and the key may not be copied. Moreover, in the field of the bio industry, when a chip is to be inserted into a human body and a signal is to be applied from an outside, smooth data exchange may become possible by disposing only one pad on the outer part of the human body, whereby convenience may be provided to a patient so as to contribute to the generalization of the application industry.

Also, in accordance with the above embodiments, since wireless communication such as RF communication is not used, the probability of exposure to hacking may be reduced, and since it is not necessary to additionally insert an antenna, circuit design may be easily and conveniently implemented.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 1:
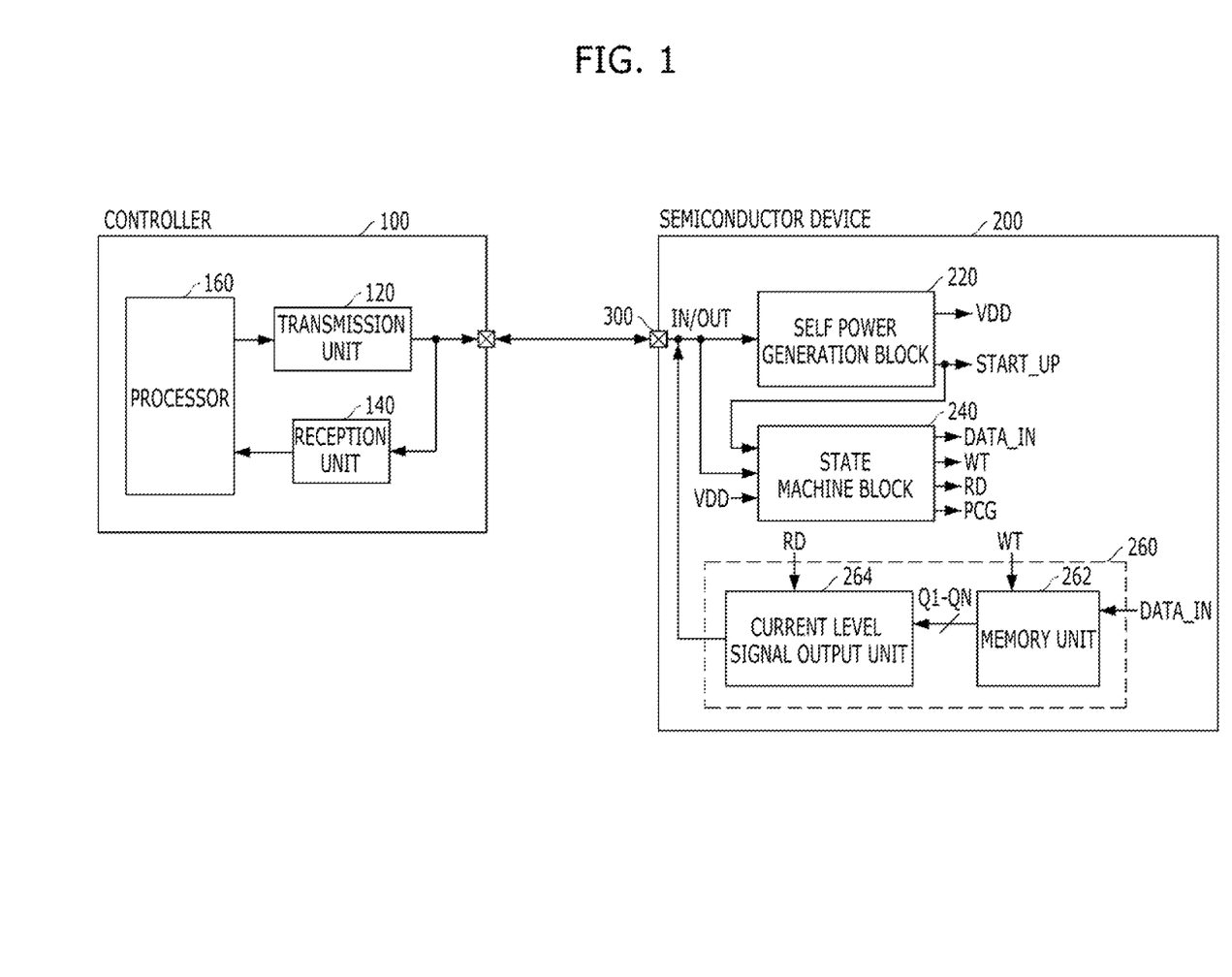
FIG. 1 is a block diagram illustrating a configuration of a semiconductor system in accordance with an exemplary embodiment of the present invention.

FIG. 1 is a block diagram illustrating a configuration of a semiconductor system in accordance with an exemplary embodiment of the present invention.

Referring to FIG. 1, the semiconductor system in accordance with the exemplary embodiment includes a controller 100, a semiconductor device 200, and a single input/output pad 300.

The semiconductor device 200 may receive a first signal from the controller 100 through the single input/output pad 300 and may generate a driving voltage VDD. The semiconductor device 200 may generate commands WT, RD and PCG and data DATA_IN to be internally used, in response to the pulse width of a second signal inputted from the controller 100 through the single input/output pad 300 when the driving voltage VDD reaches a predetermined level. The semiconductor device 200 may convert the data DATA_IN into a third signal of a corresponding current level in response to the commands WT, RD and PCG and may output the third signal to the controller 100 through the single input/output pad 300. The controller 100 may sense a change in the current level of the third signal inputted from the semiconductor device 200 and may recover data.

In detail, the semiconductor device 200 includes a self power generation block 220, a state machine block 240, and a data output block 260. The self power generation block 220 may receive the first signal inputted through the single input/output pad 300 and may generate the driving voltage VDD. The state machine block 240 may detect the pulse width of the second signal inputted through the single input/output pad 300 and may separately generate the commands WT, RD and PCG and the data DATA_IN in response to the pulse width. The data output block 260 may convert the data DATA_IN into the third signal of the corresponding current level in response to the commands RD and WT and may output the third signal through the single input/output pad 300.

According to an embodiment of the present invention, the self power generation block 220 may activate and may output a start-up signal START_UP when the driving voltage VDD is charged over a predetermined voltage. Further, the self power generation block 220 may be connected with or disconnected from the single input/output pad 300 in response to the start-up signal START_UP. For example, the self power generation block 220 may be disconnected from the single input/output pad 300 and interrupt the generation of the driving voltage VDD when the start-up signal START_UP is activated, and it may be connected with the single input/output pad 300 and resume the generation of the driving voltage VDD when the start-up signal START_UP is deactivated.

The state machine block 240 is enabled in response to the start-up signal START_UP. After the state machine block 240 is enabled in response to the start-up signal START_UP which is activated when the driving voltage VDD is charged over the predetermined voltage, the state machine block 240 is supplied with the driving voltage VDD. The state machine block 240 detects the pulse width of the second signal which is inputted through the single input/output pad 300, and separately generates the commands WT, RD and PCG and the data DATA_IN in response to the pulse width. For reference, the commands WT, RD and PCG include a write command WT which is activated in a write operation, a read command RD which is activated in a read operation, and a precharge command PCG which is used as a reset signal.

The data output block 260 includes a memory unit 262 and a current level signal output unit 264. The memory unit 262 may store a value acquired by counting the number of toggling times of the data DATA_IN, as multiple bits Q0, Q1 ... QN in response to the write command WT. The current level signal output unit 264 may output the third signal of the current level through the single input/output pad 300 in response to the read command RD and the multiple bits Q0, Q1 ... QN.

The controller 100 includes a transmission unit 120, a reception unit 140 and a processor 160. The transmission unit 120 may drive the first signal and the second signal which are transferred from the processor 160, and may output the first signal and the second signal to the single input/output pad 300. The reception unit 120 may receive the third signal of the current level which is inputted through the single input/output pad 300 and transfers the third signal to the processor 160. The processor 160 may output the first signal for generating the driving voltage VDD and the second signal for generating the commands WT, RD and PCG and the data DATA_IN, to the transmission unit 120, and may sense a change in the current level of the third signal inputted from the reception unit 140 to recover data. The processor 160 may include a current sensor which detects a change in the current level of the signal inputted through the single input/output pad 300.

Figure 2:
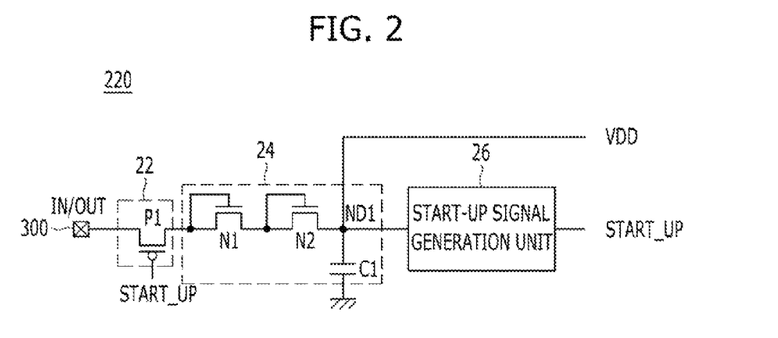
FIG. 2 is a configuration diagram illustrating the self power generation block of FIG. 1.

FIG. 2 is a configuration diagram illustrating the self power generation block 220 of FIG. 1.

Referring to FIG. 2, the self power generation block 220 includes a driving voltage generation unit 24, a start-up signal generation unit 26, and a disconnection unit 22. The driving voltage generation unit 24 may receive the first signal through the single input/output pad 300 and may generate the driving voltage VDD. The start-up signal generation unit 26 may generate the start-up signal START_UP when the driving voltage VDD is over the predetermined voltage. The disconnection unit 22 may block connection to the single input/output pad 300 in response to the activation of the start-up signal START_UP and may prevent the first signal from being transferred from the controller 100.

In detail, the driving voltage generation unit 24 includes first and second negative-channel metal-oxide semiconductor (NMOS) transistors N1 and N2 which are diode-connected and a capacitor C1. The first signal is a signal for generating the driving voltage VDD. When the first signal with a voltage level corresponding to VDD+2*Vth is supplied to the semiconductor device 200 through the single input/output pad 300 from the controller 100, the capacitor C1 is charged to the level of the driving voltage VDD through the first and second NMOS transistors N1 and N2. The driving voltage VDD may be outputted from a first node ND1 which is a common node of the first and second NMOS transistors N1 and N2 and the capacitor C1.

The start-up signal generation unit 26 receives the signal of the first node ND1 and outputs the start-up signal START_UP. That is, the start-up signal generation unit 26 outputs the start-up signal START_UP by activating it to a logic high level when the signal of the first node ND1 reaches the level of the driving voltage VDD.

The disconnection unit 22 is connected/coupled between the single input/output pad 300 and the driving voltage generation unit 24, and includes a P-type metal-oxide semiconductor (PMOS) transistor P1 which receives the start-up signal START_UP through the gate thereof. In an embodiment of the present invention, the disconnection unit 22 may connect or disconnect the single input/output pad 300 and the driving voltage generation unit 24 with or from each other in response to the start-up signal START_UP. Accordingly, if the start-up signal START_UP is activated, the disconnection unit 22 disconnects the single input/output pad 300 and the driving voltage generation unit 24 from each other and interrupts the generation of the driving voltage VDD. If the start-up signal START_UP is deactivated, the disconnection unit 22 connects the single input/output pad 300 and the driving voltage generation unit 24 with each other and resumes the generation of the driving voltage VDD. Furthermore, the controller 100 may sense a change in the current level of the signal inputted through the single input/output pad 300, through a current sensor or the like, and may interrupt the transfer of the first signal in the case where the single input/output pad 300 and the driving voltage generation unit 24 are disconnected from each other.

As can be seen from the above descriptions, the self power generation block 220 of the present disclosure may receive a signal from an external controller and generate the driving voltage VDD by itself. Also, after the targeted driving voltage VDD is generated, connection to the external controller may be blocked, and the overcharging of the driving voltage VDD may be prevented. Accordingly, unnecessary current consumption may be reduced.

Figure 3:
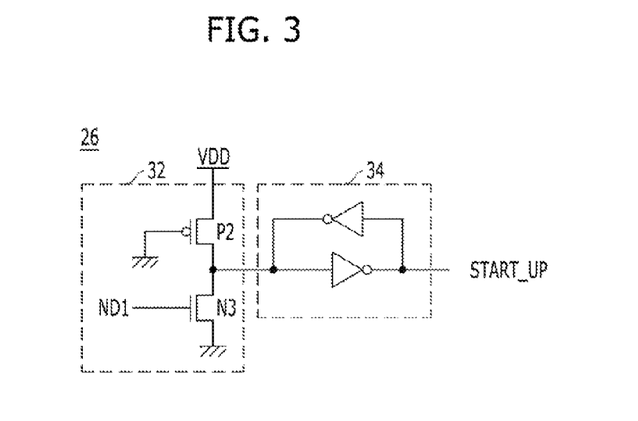
FIG. 3 is a configuration diagram illustrating a start-up signal generation unit of FIG. 2.

FIG. 3 is a configuration diagram illustrating the start-up signal generation unit 26 of FIG. 2.

Referring to FIG. 3, the start-up signal generation unit 26 includes a signal driving section 32 and a signal output section 34. The signal driving section 32 includes a PMOS transistor P2 and an NMOS transistor N3 which are connected in series between the terminal of the driving voltage VDD and the terminal of a ground voltage and respectively receive the ground voltage and the signal of the first node ND1 through the gates thereof. The signal output section 34 may include an inverter latch, and may be configured to latch the output of the signal driving section 32 and output the start-up signal START_UP.

As can be seen from the above descriptions, the start-up signal generation unit 26 of the present disclosure outputs the start-up signal START_UP in response to the signal of the first node ND1. For example, when the voltage level of the first node ND1 is smaller than the targeted level of the driving voltage VDD, the NMOS transistor N3 is turned off, the signal driving section 32 outputs a signal of a logic high level, and the signal output section 34 invert-latches the output of the signal driving section 32 and outputs the start-up signal START_UP which is deactivated to a logic low level. Conversely, when the first node ND1 is charged to have the targeted level of the driving voltage VDD, the NMOS transistor N3 is turned on, the signal driving section 32 outputs a signal of a logic low level, and the signal output section 34 outputs the start-up signal START_UP which is activated to the logic high level.

Figure 4A:
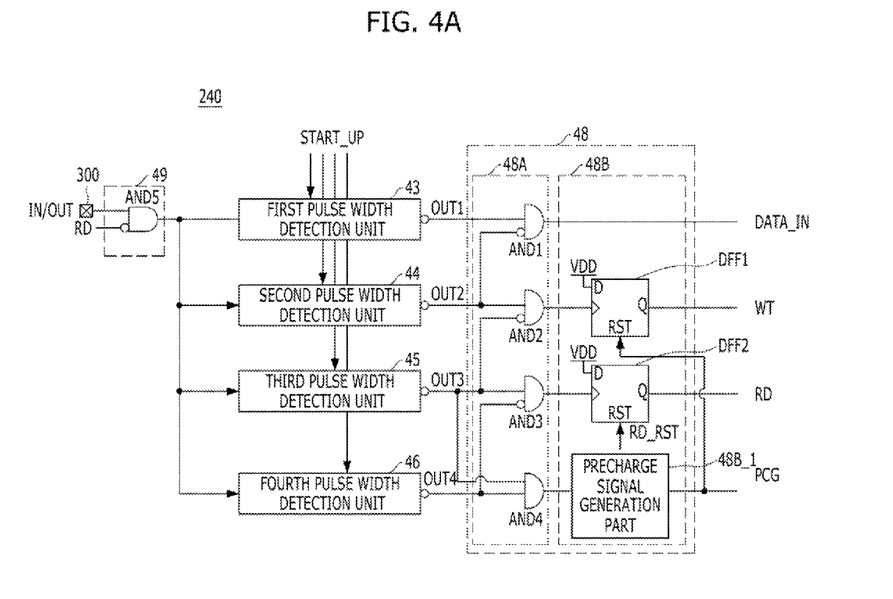
FIG. 4A is a configuration diagram illustrating a state machine block of FIG. 1.

FIG. 4A is a configuration diagram illustrating the state machine block 240 of FIG. 1.

Referring to FIG. 4A, the state machine block 240 includes first to fourth pulse width detection units 43, 44, 45 and 46, and an intrinsic signal output unit 48. The first to fourth pulse width detection units 43, 44, 45 and 46 may be activated in response to the start-up signal START_UP and may activate respective output signals in the case where the pulse width of the second signal inputted through the single input/output pad 300 is larger than a predetermined pulse width. The intrinsic signal output unit 48 may separately output the corresponding commands WT, RD and PCG and data DATA_IN in response to the output signals of the plurality of pulse width detection units 43, 44, 45 and 46.

In an embodiment of the present invention, among the first to fourth pulse width detection units 43, 44, 45 and 46, the first pulse width detection unit 43 may have the predetermined pulse width of 1 ns. In this case, the first pulse width detection unit 43 activates a first output signal OUT1 when the pulse width of the second signal inputted through the single input/output pad 300 is larger than the predetermined pulse width of 1 ns. The second pulse width detection unit 44 may have the predetermined pulse width of 10 ns. In this case, the second pulse width detection unit 44 activates a second output signal OUT2 when the pulse width of the second signal is larger than the predetermined pulse width of 10 ns. The third pulse width detection unit 45 may have the predetermined pulse width of 100 ns. In this case, the third pulse width detection unit 45 activates a third output signal OUT3 when the pulse width of the second signal is larger than the predetermined pulse width of 100 ns. The fourth pulse width detection unit 46 may have the predetermined pulse width of 300 ns. In this case, the fourth pulse width detection unit 46 activates a fourth output signal OUT4 when the pulse width of the second signal is larger than the predetermined pulse width of 300 ns.

The intrinsic signal output unit 48 includes a determining section 48A and an output section 48B. The determining section 48A may receive the first to fourth output signals OUT1, OUT2, OUT3 and OUT4 and may separately generate the corresponding commands WT, RD and PCG and data DATA_IN. The output section 48B may latch the output of the determining section 48A and may output a resultant signal.

The determining section 48A includes first to fourth logic parts AND1, AND2, AND3 and AND4 which respectively receive the first to fourth output signals OUT1, OUT2, OUT3 and OUT4. The first to fourth logic parts AND1, AND2, AND3 and AND4 may include AND gates. The first to fourth logic parts AND1, AND2, AND3 and AND4 may include AND gates each of which receives two consecutive output signals among the first to fourth output signals OUT1, OUT2, OUT3 and OUT4. In detail, the first logic part AND1 performs an AND operation using the first output signal OUT1 and the inverted signal of the second output signal OUT2. The second logic part AND2 performs an AND operation using the second output signal OUT2 and the inverted signal of the third output signal OUT3. The third logic part AND3 performs an AND operation using the third output signal OUT3 and the inverted signal of the fourth output signal OUT4. The fourth logic part AND4 performs an AND operation using the third output signal OUT3 and the fourth output signal OUT4.

The output section 48B outputs the output of the first logic part AND1 as the data DATA_IN, and latches the respective outputs of the second to fourth logic parts AND2, AND3 and AND4 and outputs the commands WT, RD and PCG. The output section 48B may include first and second flip-flops DFF1 and DFF2 which receive the driving voltage VDD through input terminals D thereof and receive the outputs of the second and third logic parts AND2 and AND3 through clock terminals thereof, and a precharge signal generation part 48B_1.

In detail, the first flip-flop DFF1 receives the driving voltage VDD through an input terminal D, the output of the second logic part AND2 through a clock terminal and the precharge command PCG through a reset terminal RST, and outputs the write command WT. The second flip-flop DFF2 receives the driving voltage VDD through an input terminal D, the output of the third logic part AND3 through a clock terminal and a read reset signal RD_RST through a reset terminal RST, and outputs the read command RD. The precharge signal generation part 48B_1 may buffer the output of the fourth logic part AND4 and output the precharge command PCG. The precharge command PCG is used as the reset signal of the first flip-flop DFF1, and the read reset signal RD_RST is used as the reset signal of the second flip-flop DFF2. The read reset signal RD_RST is a signal which is activated in response to the read command RD or the precharge command PCG.

In a read operation, a read-with-auto-precharge operation is basically performed. Hence, in an embodiment of the present invention, if a predetermined time has passed after the read command RD is activated and data is read through the single input/output pad 300, the second flip-flop DFF2 may be reset to initialize the read command RD.

In the read operation, as the data is read through the single input/output pad 300, the voltage level of the driving voltage VDD drops by the voltage level corresponding to the read data. In order to prevent the state machine block 240 from being influenced by such a voltage drop on its input value and generating a command signal improperly in the read operation, masking is performed during the read operation so as to keep the state machine block 240 from receiving the signal inputted through the single input/output pad 300. To this end, as shown in FIG. 4A, a data masking unit 49 may be provided. The data masking unit 49 may include an AND gate AND5 which receives the signal inputted through the single input/output pad 300 and the inverted signal of the read command RD.

As can be seen from the above descriptions, after being enabled in response to the start-up signal START_UP which is activated when the driving voltage VDD is charged over the predetermined voltage, the state machine block 240 of the present disclosure is supplied with the driving voltage VDD, detects the pulse width of the second signal which is inputted through the single input/output pad 300, and separately generates the commands WT, RD and PCG and the data DATA_IN in response to the pulse width. Therefore, the operation of the state machine block 240 is not in a collision with the driving voltage charging operation of the self power generation block 220. Also, in the read operation, masking is performed so as to keep the state machine block 240 from receiving the signal inputted through the single input/output pad 300, so that a command is properly generated.

Figure 4B:
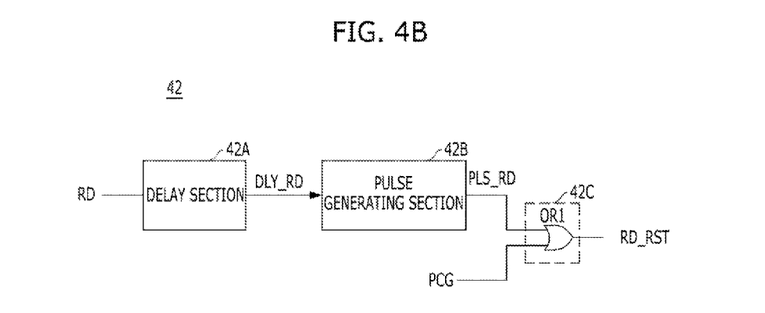
FIG. 4B is a configuration diagram illustrating a read reset signal generation unit for generating a read reset signal of FIG. 4A.

FIG. 4B is a configuration diagram illustrating a read reset signal generation unit for generating the read reset signal RD_RST of FIG. 4A.

Referring to FIG. 4B, a read reset signal generation unit 42 includes a delay section 42A, a pulse generating section 42B, and a logic operating section 42C. The delay section 42A may receive the read command RD, may delay the read command RD by a predetermined time, and may generate a delayed signal DLY_RD.

The pulse generating section 42B may receive the delayed signal DLY_RD and may generate a pulse signal PLS_RD in the form of a pulse which is activated for a predetermined period. The logic operating section 42C may activate and may output the read reset signal RD_RST when the pulse signal PLS_RD or the precharge command PCG is activated. For reference, the logic operating section 42C may include an OR gate OR1. Since the pulse generating section 42B has the configuration generally known in the art, a detailed description thereof will be omitted.

Figure 5:
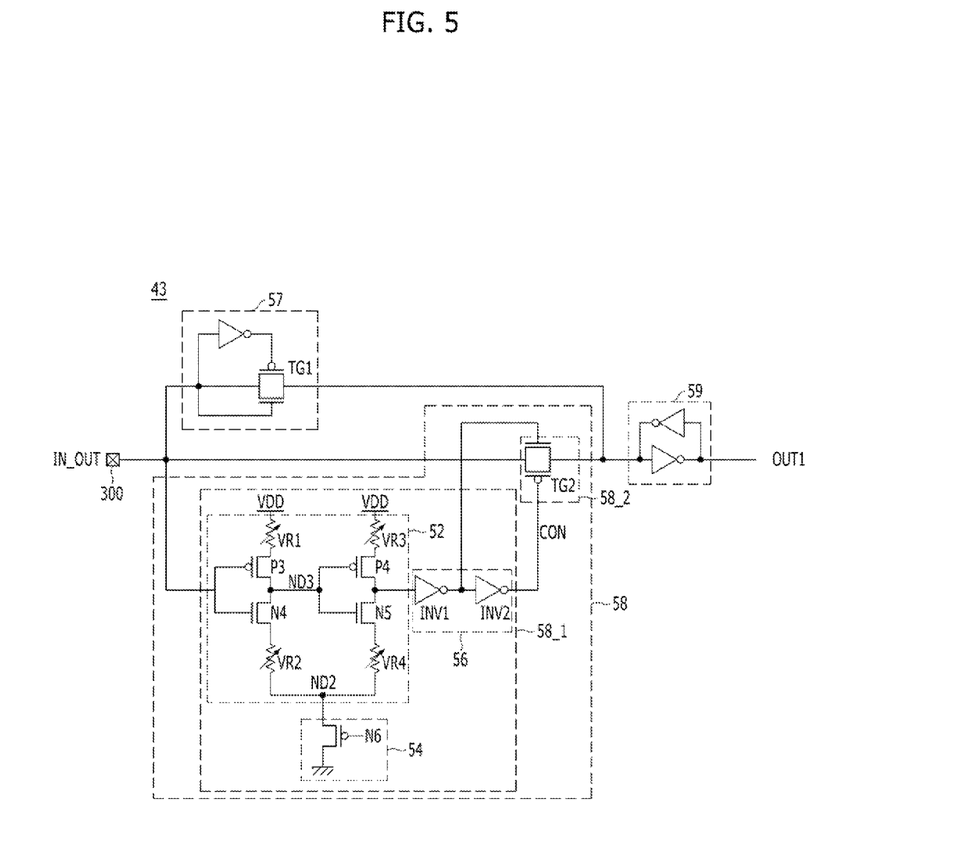
FIG. 5 is a configuration diagram illustrating a first pulse width detection unit of FIG. 4A.

FIG. 5 is a configuration diagram illustrating the first pulse width detection unit 43 of FIG. 4A.

Referring to FIG. 5, the first pulse width detection unit 43 includes a deactivation state transferring section 57, an activation state transferring section 58, and a latch section 59. The deactivation state transferring section 57 may transfer the second signal inputted through the single input/output pad 300, to the latch section 59 when the second signal is deactivated to a logic high level. The activation state transferring section 58 may transfer the second signal to the latch section 59 only in the case when the pulse width of the second signal is larger than the predetermined pulse width and the second signal is activated to a logic low level. The latch section 59 may latch the signals transferred from the deactivation state transferring section 57 and the activation state transferring section 58 and may output the first output signal OUT1.

The deactivation state transferring section 57 may include a first transfer gate TG1 which receives and transfers the second signal inputted through the single input/output pad 300 in response to the second signal. The latch section 59 may include an inverter latch. The activation state transferring section 58 includes a control signal generation part 58_1 and a transfer part 58_2. The control signal generation part 58_1 may be activated in response to the start-up signal START_UP and activate a control signal CON in the case when the pulse width of the second signal is larger than the predetermined pulse width. The transfer part 58_2 may include a second transfer gate TG2 which is controlled in response to the control signal CON. Therefore, when the pulse width of the second signal is larger than the predetermined pulse width and the second signal is activated to the logic low level, the activation state transferring section 58 transfers the second signal to the latch section 59 and the latch section 59 invert-latches the second signal and outputs the first output signal OUT1 which is activated to a logic high level.

In detail, the control signal generation part 58_1 includes a filter 52, a buffer 56, and an enabler 54. The filter 52 may filter the second signal and may output a filtered signal when the pulse width of the second signal is larger than the predetermined pulse width. The buffer 56 may buffer the output of the filter 52 and may output the control signal CON. The enabler 54 may activate the filter 52 in response to the start-up signal START_UP.

The filter 52 includes first to fourth variable resistors VR1, VR2, VR3 and VR4, first and second PMOS transistors P3 and P4, and first and second NMOS transistors N4 and N5.

The first variable resistor VR1, the first PMOS transistor P3, the first NMOS transistor N4 and the second variable resistor VR2 are connected in series between the terminal of the driving voltage VDD and a second node ND2. The first PMOS transistor P3 and the first NMOS transistor N4 receive the second signal inputted through the single input/output pad 300, through the gates thereof. The third variable resistor VR3, the second PMOS transistor P4, the second NMOS transistor N5 and the fourth variable resistor VR4 are connected in series between the terminal of the driving voltage VDD and the second node ND2. The second PMOS transistor P4 and the second NMOS transistor N5 receive the signal of a third node ND3 which is the common node of the first PMOS transistor P3 and the first NMOS transistor N4, through the gates thereof. The resistance values of the first to fourth variable resistors VR1, VR2, VR3 and VR4 may be controlled in response to an intrinsic pulse width. For example, the predetermined pulse width of the first pulse width detection unit 43 may be set to 1 ns, and the resistance values of the first to fourth variable resistors VR1, VR2, VR3 and VR4 may be set in such a way as to activate the first output signal OUT1 when the pulse width of the inputted second signal is larger than 1 ns.

The buffer 56 includes two inverters INV1 and INV2 which are connected in series. The buffer 56 buffers the output of the filter 52 and outputs the control signal CON.

The enabler 54 includes an NMOS transistor N6 which is connected between the second node ND2 and the terminal of the ground voltage and receives the start-up signal START_UP through the gate thereof.

For reference, since the first to fourth pulse width detection units 43, 44, 45 and 46 have the same configuration except that the resistance values set in the first to fourth variable resistors VR1, VR2, VR3 and VR4 of the filter 52 are different, detailed descriptions thereof will be omitted.

As can be seen from the above descriptions, the first to fourth pulse width detection units 43, 44, 45 and 46 are activated in response to the start-up signal START_UP, and activate the corresponding output signals in the case where the pulse width of the second signal inputted through the single input/output pad 300 is larger than the predetermined pulse width. Further, since the first to fourth pulse width detection units 43, 44, 45 and 46 include latch type circuits, they may prevent glitch-type noise from being generated due to different resistance values.

Figure 6:
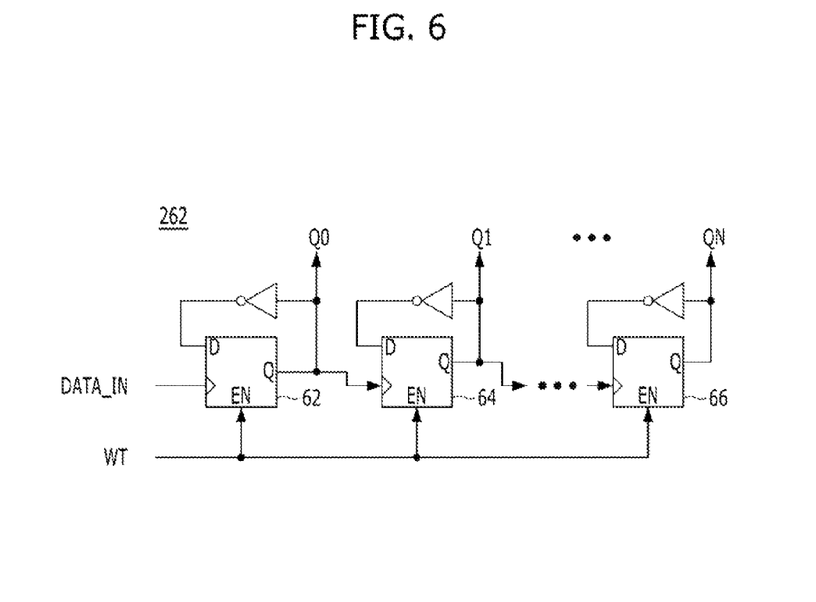
FIG. 6 is a configuration diagram illustrating a memory unit of FIG. 1.

FIG. 6 is a configuration diagram illustrating the memory unit 262 of the data output block 260 of FIG. 1.

Referring to FIG. 6, the memory unit 262 includes a multi-bit counter which is enabled in response to the write command WT, counts the number of toggling times of the inputted data DATA_IN, and outputs a counting value as multiple bits Q0, Q1 . . . QN.

The multi-bit counter may be constituted by a plurality of D flip-flops 62, 64 and 66 which are connected in series. The D flip-flop 62 disposed at a first stage among the plurality of D flip-flops 62, 64 and 66 is enabled in response to the write command WT, receives the inverted signal of its output through an input terminal D, and receives the data DATA_IN through a clock terminal. The remaining D flip-flops 64 and 66 of the next stages are enabled in response to the write command WT, receive the inverted signals of their outputs to through input terminals D, and receive the outputs of the previous stages through clock terminals. For example, in the case of data DATA_IN toggling 3 times with 5 ns pulse width, the plurality of D flip-flops 62, 64 and 66 store the data DATA_IN in the binary form and output multiple bits Q0, Q1 . . . QN.

As can be seen from the above descriptions, the memory unit 262 of the present disclosure stores the counting value of the number of toggling times of the data DATA_IN as multiple bits Q0, Q1 . . . QN, in response to the write command WT in a write mode.

Figure 7:
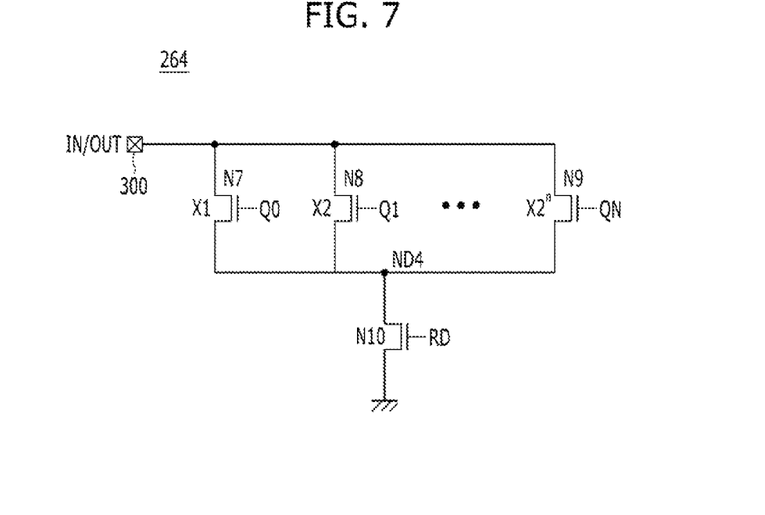
FIG. 7 is a configuration diagram illustrating a current level signal output unit of FIG. 1.

FIG. 7 is a configuration diagram illustrating the current level signal output unit 264 of the data output block 260 of FIG. 1.

Referring to FIG. 7, the current level signal output unit 264 includes a plurality of transistors N7, N8 and N9 and a bias section N10. The plurality of transistors N7, N8 and N9 are connected in parallel between the single input/output pad 300 and a fourth node ND4, respectively receive corresponding bits among the multiple bits Q0, Q1 . . . QN outputted from the memory unit 262, and output the third signal of the current level corresponding to the multiple bits. The bias section N10 supplies a bias voltage to the fourth node ND4 in response to the read command RD.

The plurality of transistors N7, N8 and N9 may have different sizes, respectively. The plurality of transistors N7, N8 and N9 may be designed such that one size is larger than another by two times. Thus, the plurality of transistors N7, N8 and N9 are turned on when the corresponding bits among the multiple bits Q0, Q1 . . . QN are high levels, then change and output an amount of current flowing to the single input/output pad 300.

As can be seen from the above descriptions, the current level signal output unit 264 of the present disclosure converts the multiple bits Q0, Q1 . . . QN into the third signal of the corresponding current level in response to the read command RD in a read mode, and outputs the third signal of the current level through the single input/output pad 300.

Figure 8:
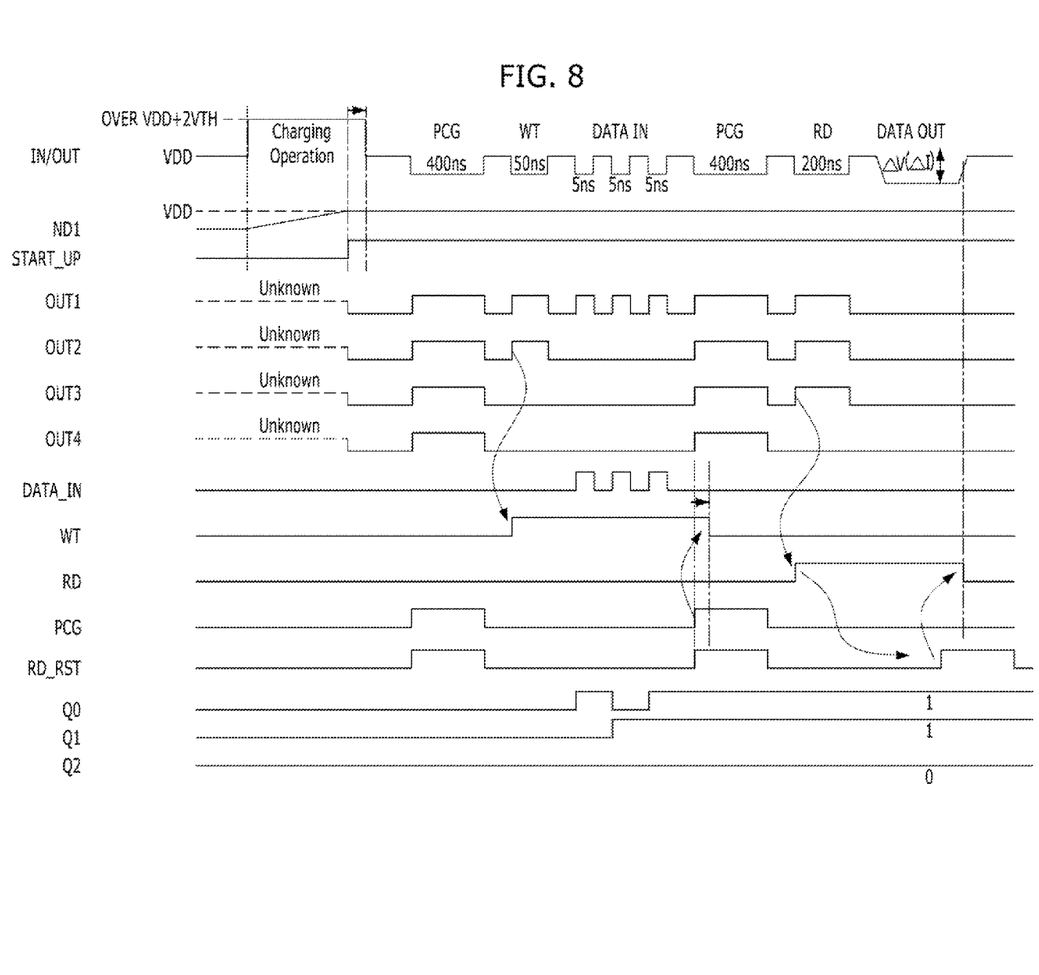
FIG. 8 is a timing diagram describing operation of the semiconductor system in accordance with an exemplary embodiment of the present invention.

FIG. 8 is a timing diagram describing operation of the semiconductor system in accordance with an embodiment of the present invention.

Hereinbelow, operation of the semiconductor system in accordance with the embodiment will be described with reference to FIGS. 1 to 8.

Referring to FIG. 8, the first signal with the voltage level corresponding to VDD+2*Vth is supplied from the controller 100 through the single input/output pad 300 to the semiconductor device 200. Since the start-up signal START_UP is deactivated to the logic low level, the disconnection unit 22 of the self power generation block 220 is turned on and connects the single input/output pad 300 and the driving voltage generation unit 24 with each other, accordingly, the driving voltage VDD is charged into the capacitor C1 through the first and second NMOS transistors N1 and N2 and is outputted to through the first node ND1. Thereafter, the start-up signal generation unit 26 receives the signal of the first node ND1, and outputs the start-up signal START_UP by activating it to the logic high level, accordingly, the disconnection unit 22 disconnects the single input/output pad 300 and the driving voltage generation unit 24 from each other and interrupts the generation of the driving voltage VDD. Further, the controller 100 may detect a change in the current level of the signal inputted through the single input/output pad 300, through a current sensor or the like, may interrupt the transfer of the first signal for generating the voltage when the single input/output pad 300 and the driving voltage generation unit 24 are disconnected from each other, and may transfer the second signal for generating the signals.

The state machine block 240 of the semiconductor device 200 is activated in response to the start-up signal START_UP, and separately generates the commands WT, RD and PCG and data DATA_IN to be internally used, in response to the pulse width of the second signal inputted from the controller 100. At this time, since the read command RD is deactivated to a logic low level, the data masking unit 49 of the state machine block 240 does not mask the second signal inputted through the single input/output pad 300 from the controller 100 and transfers the second signal as it is.

Hereinbelow, it is described as an example that the predetermined pulse width of the first pulse width detection unit 43 of the state machine block 240 is 1 ns, the predetermined pulse width of the second pulse width detection unit 44 is 10 ns, the predetermined pulse width of the third pulse width detection unit 45 is 100 ns, and the predetermined pulse width of the fourth pulse width detection unit 46 is 300 ns.

First, descriptions will be made for a first operation wherein the write command WT of the pulse width of 50 ns is inputted, a write operation in which the data DATA_IN of the pulse width of 5 ns is consecutively inputted is performed, and the precharge command PCG of the pulse width of 400 ns is inputted.

In the first operation, the first pulse width detection unit 43 of the state machine block 240 activates the first output signal OUT1 when the pulse width of the second signal inputted through the single input/output pad 300 is larger than the predetermined pulse width of 1 ns. Accordingly, the first output signal OUT1 has the inverted level of the inputted second signal. The second pulse width detection unit 44 activates the second output signal OUT2 when the pulse width of the second signal is larger than the predetermined pulse width of 10 ns. Accordingly, the second output signal OUT2 has the inverted level of the second signal excluding the data DATA_IN. The third pulse width detection unit 45 activates the third output signal OUT3 when the pulse width of the second signal is larger than the predetermined pulse width of 100 ns. Accordingly, the third output signal OUT3 has the inverted level of the second signal excluding the data DATA_IN and the write command WT. The fourth pulse width detection unit 46 activates the fourth output signal OUT4 when the pulse width of the second signal is larger than the predetermined pulse width of 300 ns. Accordingly, the fourth output signal OUT4 has the same level as the third output signal OUT3, that is, the inverted level of the second signal excluding the data DATA_IN and the write command WT.

The intrinsic signal output unit 48 of the state machine block 240 sequentially activates the write command WT, the data DATA_IN and the precharge command PCG in response to the first to fourth output signals OUT1, OUT2, OUT3 and OUT4 of the plurality of pulse width detection units 43, 44, 45 and 46.

The memory unit 262 of the data output block 260 stores the value acquired by counting the number of toggling times of the data DATA_IN, as the multiple bits Q0, Q1 . . . QN in response to the write command WT. Afterwards, the write command WT is initialized to a logic low level according to the activation of the precharge command PCG.

Next, descriptions will be made for a second operation wherein the read command RD of the pulse width of 200 ns is inputted, a read operation is performed, and the third signal of the current level is read.

In the second operation, the pulse width detection units 43, 44, 45 and 46 of the state machine block 240 detect the pulse width of the second signal inputted through the single input/output pad 300 and generate the first to fourth output signals OUT1, OUT2, OUT3 and OUT4. The first to third pulse width detection units 43, 44 and 45 output the first to third output signals OUT1, OUT2 and OUT3 which have the inverted level of the inputted second signal, and the fourth pulse width detection unit 46 outputs the fourth output signal OUT4 which has the inverted level of the second signal excluding the read command RD.

The intrinsic signal output unit 48 of the state machine block 240 activates the read command RD in response to the first to fourth output signals OUT1, OUT2, OUT3 and OUT4 of the plurality of pulse width detection units 43, 44, 45 and 46. According to the activated read command RD, the current level signal output unit 264 of the data output block 260 inverts the multiple bits Q0, Q1 . . . QN stored in the memory unit 262, into the third signal of the corresponding current level, and outputs the third signal through the single input/output pad 300. Afterwards, when a predetermined time has passed, the read reset signal RD_RST may be activated to initialize the read command RD.

The reception unit 140 of the controller 100 receives the third signal of the current level inputted through the single input/output pad 300 and transfers the third signal to the processor 160. The processor 160 senses a change in the current level of the third signal and recovers data.

In the read operation, the read command RD is activated to a logic high level, and the data masking unit 49 masks the input of the second signal which is inputted through the single input/output pad 300. Thus, the state machine block 240 is prevented from generating commands improperly in the read operation.

As is apparent from the above descriptions, according to the embodiment of the present invention, a memory device may receive a signal from an external controller using a single input/output pad coupled between the controller and the memory device and generate by itself a driving voltage VDD. The memory device may separately generate commands and data in response to the pulse width of a signal inputted through the single input/output pad after the driving voltage VDD is charged over a predetermined voltage. The memory device may convert the data into a third signal of a current level corresponding to the data in response to the commands and output the third signal. As a consequence, the number of ports and/or pads of the memory device may be decreased thus the area of the memory device may be reduced.

Moreover, due to the fact that the memory device generates by itself the driving voltage VDD by receiving the signal from the external controller using the single input/output pad and blocks connection with the external controller after the driving voltage VDD is generated, unnecessary current consumption may be reduced.

Although various embodiments have been described for illustrative purposes, it will be apparent to those skilled in the art that various changes and modifications may be made without departing from the spirit and scope of the Invention as defined in the following claims.

What is claimed is:

1. A semiconductor system comprising:
a controller; and
a semiconductor device suitable for communicating one or more signals with the controller through a single input/output pad, wherein the semiconductor device comprises:
a self power generation block suitable for generating a driving voltage in response to a first signal inputted from the controller through the single input/output pad, and generating a start-up signal when the driving voltage is over a set voltage;
a state machine block suitable for detecting a pulse width of a second signal inputted from the controller through the single input/output pad, in response to the start-up signal, and generating commands and data in response to the pulse width of the second signal; and a data output block suitable for converting the data into a third signal of a current level corresponding to the data and output the third signal to the controller through the single input/output pad, in response to the commands.

2. The semiconductor system according to claim 1, wherein the self power generation block is disconnected from the single input/output pad in response to the start-up signal.

3. The semiconductor system according to claim 2, wherein the state machine block is enabled in response to the start-up signal.

4. The semiconductor system according to claim 1, wherein the self power generation block comprises:
a driving voltage generation unit suitable for receiving the first signal and generating the driving voltage;
a start-up signal generation unit suitable for generating the start-up signal for enabling the state machine block, when the driving voltage is charged over the set voltage; and
a disconnection unit suitable for blocking connection between the single input/output pad and the driving voltage generation unit in response to the start-up signal and transmission of the first signal from the controller.

5. The semiconductor system according to claim 4, wherein the controller comprises a current sensor which senses disconnection from the self power generation block and interrupts the transmission of the first signal.

6. The semiconductor system according to claim 1, wherein the state machine block comprises:
a plurality of pulse width detection units activated in response to the start-up signal, and activating respective output signals when the pulse width of the second signal is larger than respective set pulse widths, which are different from each other; and
an intrinsic signal output unit suitable for outputting the commands and the data in response to the output signals of the plurality of pulse width detection units.

7. The semiconductor system according to claim 6, wherein each of the pulse width detection units comprises:
a deactivation state transferring section suitable for transferring the second signal when the second signal is deactivated;
an activation state transferring section suitable for transferring the second signal when the second signal is activated and the pulse width of the second signal is larger than the set pulse width; and
a latch section suitable for latching an output of the deactivation state transferring section or the activation state transferring section, and outputting the output signal.

8. The semiconductor system according to claim 7, wherein the activation state transferring section comprises:
a control signal generation part suitable for activating a control signal when the pulse width of the second signal is larger than the set pulse width; and
a transfer part suitable for transferring the second signal in response to the control signal.

9. The semiconductor system according to claim 6, wherein the intrinsic signal output unit comprises:
a determining section suitable for receiving the output signals of the plurality of pulse width detection units, and determining the commands and the data to be outputted; and
an output section suitable for latching an output of the determining section and outputting a resultant signal as the commands and the data.

10. The semiconductor system according to claim 6, wherein the state machine block further comprises:
a data masking unit suitable for block transmission of the second signal to the plurality of pulse width detection units, in a read operation.

11. The semiconductor system according to claim 1, wherein the data output block comprises:
a memory unit suitable for counting the number of toggling times of the data and storing a corresponding value as multiple bits in response to a first command of the commands; and
a current level signal output unit suitable for outputting the third signal of the current level through the single input/output pad in response to a second command of the commands and the multiple bits.

12. The semiconductor system according to claim 11, wherein the current level signal output unit comprises:
a plurality of transistors coupled in parallel between the single input/output pad and a first node, and suitable for respectively receiving the multiple bits outputted from the memory unit, through gates thereof, and outputting the third signal by controlling the current level of the third signal; and
a bias section suitable for supplying a bias voltage to the first node in response to the second command.

13. The semiconductor system according to claim 11, wherein the memory unit comprises a multi-bit counter.

14. The semiconductor system according to claim 1, wherein the controller is suitable for recovering the data by sensing a change in the current level of the inputted third signal.

15. The semiconductor system according to claim 14, wherein the controller comprises:
a transmission unit suitable for driving the first signal and the second signal, and outputting the first signal and the second signal to the single input/output pad;
a reception unit suitable for receiving the third signal which is inputted through the single input/output pad; and
a processor suitable for outputting the first signal and the second signal to the transmission unit, and sensing the change in the current level of the third signal inputted from the reception unit recovering the data.

16. A method for driving a semiconductor system including a controller and a semiconductor device, the method comprising:
inputting a first signal from the controller to the semiconductor device through a single input/output pad and generating a driving voltage of the semiconductor device using the first signal in the semiconductor device;
inputting a second signal from the controller to the semiconductor device through the single input/output pad and generating commands and data in response to a pulse width of the second signal in the semiconductor device, when the driving voltage reaches a set level; and
converting the data into a third signal of a current level corresponding to the data in response to the commands in the semiconductor device and outputting the third signal from the semiconductor device to the controller through the single input/output pad.

17. The method according to claim 16, further comprising:
sensing a change in the current level of the third signal and recovering data in the controller.

18. The method according to claim 16, further comprising, before the inputting of the second signal:
blocking the first signal inputted from the controller in the semiconductor device, when the driving voltage reaches the set level, and
interrupting the inputting of the first signal by sensing the blocking of the first signal in the controller.

19. The method according to claim 16, wherein the generating of the commands and the data in response to the pulse width of the second signal, comprises:
- activating a detection signal when the pulse width of the second signal is larger than a set pulse width;
- determining the commands and the data in response to the detection signal; and
- latching a determination result and outputting a resultant signal.

20. The method according to claim 16, further comprising, after the generating of the data:
- counting the number of toggling times of the data and storing a counted value as multiple bits in response to a first command of the commands, in a write operation,
- wherein the converting of the data into the third signal comprises generating the third signal in response to a second command of the commands and the multiple bits, in a read operation.

21. A semiconductor system comprising:
- a single input/output pad;
- a controller suitable for transferring first and second signals through the single input/output pad and sensing the signals transferred through the single input/output pad; and
- a semiconductor device suitable for receiving the first and second signals through the single input/output pad, generating a driving voltage in response to the first signal, generating a start-up signal when the driving voltage is over a set voltage, detecting a pulse width of the second signal in response to the start-up signal, generating commands and data in response to the second signal, and transferring a third signal corresponding to the data to the controller through the single input/output pad in response to the commands.

22. The semiconductor system according to claim 21, wherein the semiconductor device comprising:
- a self power generation block suitable for generating the driving voltage in response to the first signal and generating the start-up signal when the driving voltage is over the set voltage, and disconnected from the single input/output pad in response to the start-up signal;
- a state machine block suitable for detecting the pulse width of the second signal in response to the start-up signal, and generating the commands and the data in response to the detected pulse width of the second signal; and
- a data output block suitable for generating the third signal of a current level corresponding to the data in response to the commands.

23. The semiconductor system according to claim 22, wherein the controller is suitable for interrupting the transfer of the first signal by sensing disconnection of the self power generation block from the single input/output pad, and recovering the data by sensing a change in the current level of the third signal.

* * * * *